United States Patent [19]

Shuhara et al.

[11] Patent Number: 5,097,793
[45] Date of Patent: Mar. 24, 1992

[54] THIN FILM VACUUM EVAPORATION DEVICE

[75] Inventors: Akira Shuhara; Kazuhiro Oka; Takeshi Morita; Megumi Ohmine, all of Amagasaki, Japan

[73] Assignee: Mitsubishi Denki Kabushiki Kaisha, Tokyo, Japan

[21] Appl. No.: 513,846

[22] Filed: Apr. 24, 1990

[30] Foreign Application Priority Data

May 11, 1989 [JP] Japan .................................. 1-118199
Jun. 22, 1989 [JP] Japan .................................. 1-160459

[51] Int. Cl.$^5$ ............................................. C23C 16/00
[52] U.S. Cl. ................................... 118/715; 118/620; 118/722; 118/726; 204/298.02; 427/42; 427/53.1
[58] Field of Search ............... 118/715, 722, 723, 725, 118/726, 727, 620; 204/192.1, 192.11, 298.02, 298.04, 298.07, 298.28; 156/610; 427/42, 53.1, 248.1

[56] References Cited

U.S. PATENT DOCUMENTS 4,726,320 2/1988 Ichikawa .............................. 118/715
4,966,887 10/1990 Garvey ................................. 427/57

FOREIGN PATENT DOCUMENTS 3800680 7/1989 Fed. Rep. of Germany .
2607830 6/1988 France .
61-79765 4/1986 Japan ................................... 118/726
61-79766 4/1986 Japan ................................... 118/726
62-174370 7/1987 Japan ................................... 118/715
2212819 8/1989 United Kingdom .

OTHER PUBLICATIONS

Takeshi Morita et al, "Ceramic Vapor Deposition on Aluminum Ally with $CO_2$ Laser", May, 1987, pp. 497-503.

D. Bauerle, "Laser-Induced Formation and Surface Processing of High-Temperature Superconductors", Feb. 20, 1989, pp. 527-541.

A. Inam et al, "As-deposited high $T_c$ and $J_c$ superconducting thin films made at low temperatures", Jul. 11, 1988, pp. 908-910.

Primary Examiner—Shrive Beck
Assistant Examiner—Terry J. Owens
Attorney, Agent, or Firm—Oblon, Spivak, McClelland, Maier & Neustadt

[57] ABSTRACT

A thin film vacuum evaporation device having a reaction gas supplier for locally supplying a reaction gas to the evaporating point on a target. The device includes a reaction chamber that can be kept under vacuum with a light transmitting window disposed therein allowing the passage of a laser beam on the target. Also, a differential pressure chamber may be provided between the target and the light transmitting window, and a gas introducing section may be connected to the differential pressure chamber. Thus, the vapor generated by the target is prevented from adhering to the light transmitting window, and the light transmitting window can be kept clean.

8 Claims, 9 Drawing Sheets

THIN FILM VACUUM EVAPORATION DEVICE

BACKGROUND OF THE INVENTION

1. Field of the Invention

The present invention relates to a thin film vacuum evaporation device, and more particularly, it relates to a thin film vacuum evaporation device in which a beam of light is directed to a target set in a vacuum to evaporate a part of the target, so as to make a film.

2. Description of the Background Art

Figure 1:
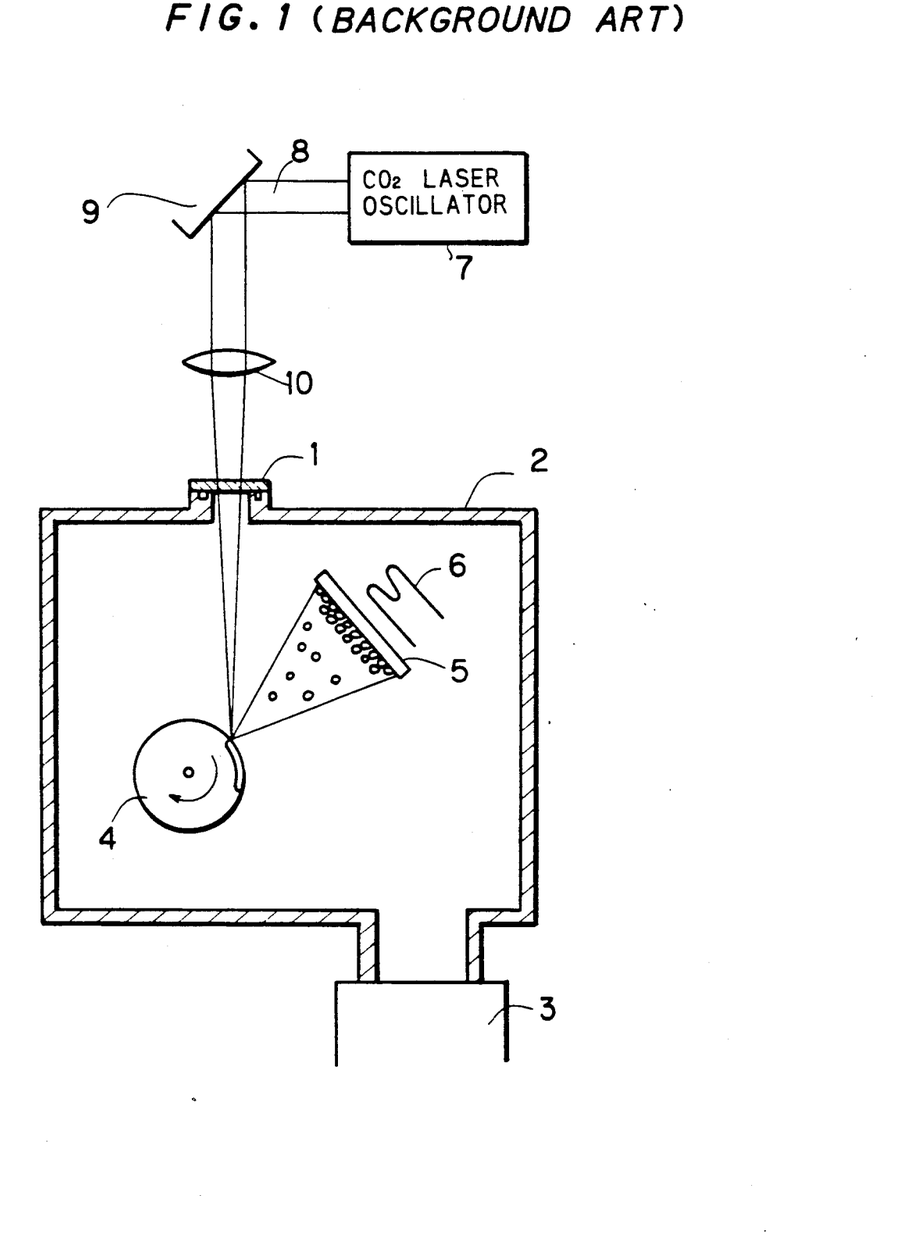
FIG. 1 is a schematic diagram showing a conventional thin film vacuum evaporation device.

There has been growing an interest in a method where a light source high luminous intensity, such as a laser beam, is employed as a means for forming a thin film of a substance having a high fusing point and high insulating property, such as ceramics. FIG. 1 is a schematic diagram showing a conventional thin film vacuum evaporation device.

As shown in FIG. 1, a discharging means 3 is connected to a reaction chamber 2 having a light transmitting window 1. This discharging means 3 functions to keep a hard vacuum in the reaction chamber 2 at the level of $10^{-3}$ Torr, desirably at the level of $10^{-4}$ to $10^{-6}$ Torr. In the reaction chamber 2, a target 4 consisting of alumina, quartz glass, or the like is rotatably held. Further, a member 5 to be deposited, such as a substrate, is disposed opposite to the target 4, and a heater 6 is placed for heating the substrate 5. Outside the reaction chamber 2, for example, a laser oscillator 7 such as a $CO_2$ laser oscillator is placed. Laser beam 8 emitted from the laser oscillator 7 reflects at a mirror 9, focuses through the focusing lens 10, passes through the light transmitting window 1, and strikes against the target 4.

With this thin film vacuum evaporation device, first the reaction chamber 2 is brought to a hard vacuum through the discharging means 3. Then, the target 4 is rotated in a specified direction. While the substrate 5 is heated by the heater 6, as required, the laser beam 8 is emitted by the laser oscillator 7. The laser beam 8 emitted by the laser oscillator 7 reflects at the mirror 9, focuses through the focusing lens 10, passes through the light transmitting window 1 and strikes against the target 4. Thus, due to the laser beam 8 focusing on the target 4, the energy density of the laser beam 8 on the target 4 is very high. This enables the target 4 made of a substance having a high fusing point, such as alumina quartz glass, etc., to fuse and evaporate. The vapor produced from the target 4 is not scattered by the remaining gas in the reaction chamber 2, because a hard vacuum is kept in the reaction chamber 2, and most of the vapor reaches to the substrate 5. The vapor is deposited and solidified on the surface of the substrate 5 to be a thin film.

The thin film is formed in the way as has been described. However, a part of molecules composing the target 4 may be decomposed on evaporation, and hence, the composition of the thin film and that of the target 4 are not necessarily the same. For example, when oxide such as quartz glass and alumina is evaporated and deposited, a thin film having a slightly low oxygen concentration may often be formed. Usually, such a film does not fixedly adhere to the substrate 5 and easily comes off.

To improve the quality of the film, usually the vapor deposition is performed in an atmosphere of a reaction gas. If an oxide is used, the vapor deposition is performed in the atmosphere of oxygen. However, to improve the quality of the film in this way, the pressure within the reaction chamber 2 must be considerably high, and a large quantity of gas is required. Consequently, because of the scattering of the vapor against the reaction gas, there arises the problem that the speed of the vapor deposition is lowered, or the heater 6 for heating the substrate 5 is deteriorated due to oxidation. When an oil diffusing pump is used as the discharging means 3, the counter-flow rate of vaporized oil is increased. This causes the problem that the substrate 5 and the thin film are polluted by the oil, or the lifetime of the pump is shortened because of significant oxidation of the oil.

The vapor generated from the target 4 moves in all the directions, and then a small quantity of it reaches the light transmitting window 1 and adheres to the surface thereof. This gradually clouds the light transmitting window 1 to reduce the transmissivity. The transmissivity is lowered as much as 16% by simply performing the vapor deposition for 30 minutes after 100 W energy is supplied by the laser power source. As the transmissivity reduces, a part of the laser energy is absorbed by the light transmitting window 1, and hence the temperature of the light transmitting window 1 rises. The rising in temperature causes the change in the refractive index of the light transmitting window 1, and then this causes thermal lens effect. The thermal lens effect results in the energy density on the target 4 decreasing, and then this results in lowering the vaporizing speed. As a result, the light transmitting window 1 must be changed properly. With a conventional device, its light transmitting window must be changed every 20- to 30-minute-vapor deposition. Every time the light transmitting window 1 is changed, a vacuum state in the reaction chamber 2 is to be released, and this causes the disadvantage that the manufacturing efficiency is very poor.

SUMMARY OF THE INVENTION

The present invention is intended for a thin film vapor deposition device in which a beam of light is directed to a target set in a vacuum to make a thin film.

According to a first aspect of the present invention, the thin film vacuum evaporation device comprises a reaction chamber having a light transmitting window, discharging means connected to the reaction chamber for keeping a hard vacuum in the reaction chamber, a target held in the reaction chamber, light beam leading means for directing a beam of light to the target through the light transmitting window to evaporate a part of the target, a member held in the reaction chamber, on which component material of the target is deposited, and gas supplying means for locally supplying a reaction gas to a light beam focusing position on the target.

According to a second aspect of the present invention, the thin film vacuum evaporation device comprises a reaction chamber having a light transmitting window, discharging means connected to the reaction chamber for keeping a hard vacuum in the reaction chamber, a target held in the reaction chamber, light beam directing means for directing a beam of light to the target through the light transmitting window to evaporate a part of the target, a member held in the reaction chamber, on which component material of the target is deposited, a differential pressure chamber enclosed by partition walls formed to cover the light transmitting window within the reaction chamber and provided with an orifice of size sufficient to pass the beam of light through on an optical path, and gas introducing means for introducing a gas into the differential pressure chamber.

Accordingly, it is an object of the present invention to provide a thin film vacuum evaporation device with which an improved quality of film can be formed by a small quantity of gas.

It is another object of the present invention to provide a thin film vacuum evaporation device in which vapor generated from the target component material does not adhere to the light transmitting window.

With the thin film vacuum evaporation device according to the first aspect of the present invention, the reaction gas is locally supplied to a light beam focusing position on the target, so that an improved quality of film can be formed by a small quantity of gas.

With the thin vacuum evaporation device according to the second aspect of the present invention, the differential pressure chamber having the orifice small but sufficient to pass the light beam through is provided, and the gas is supplied to the differential pressure chamber, whereby the pressure in the differential pressure chamber can be made higher without considerably varying the pressure in the reaction chamber. This enables the vapor generated from the target and moving to the light transmitting window to collide with the gas and scatter, and thus the vapor can be prevented from reaching the light transmitting window.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 2:
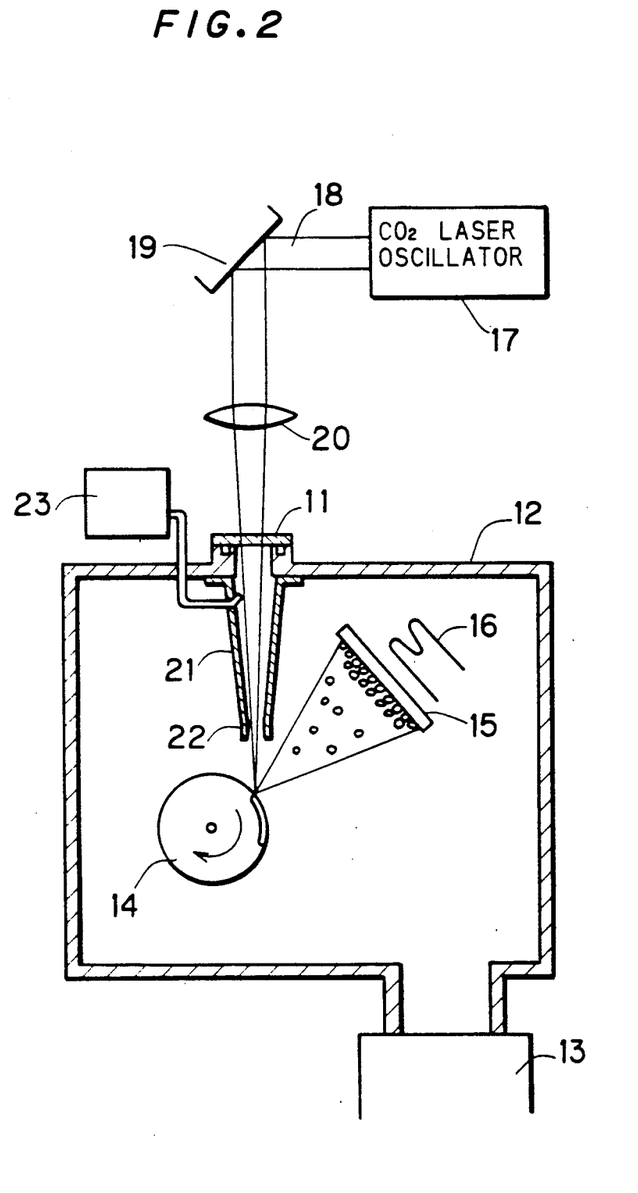
FIG. 2 is a schematic view showing a thin film vacuum evaporation device according to an embodiment of the present invention.
Figure 3:
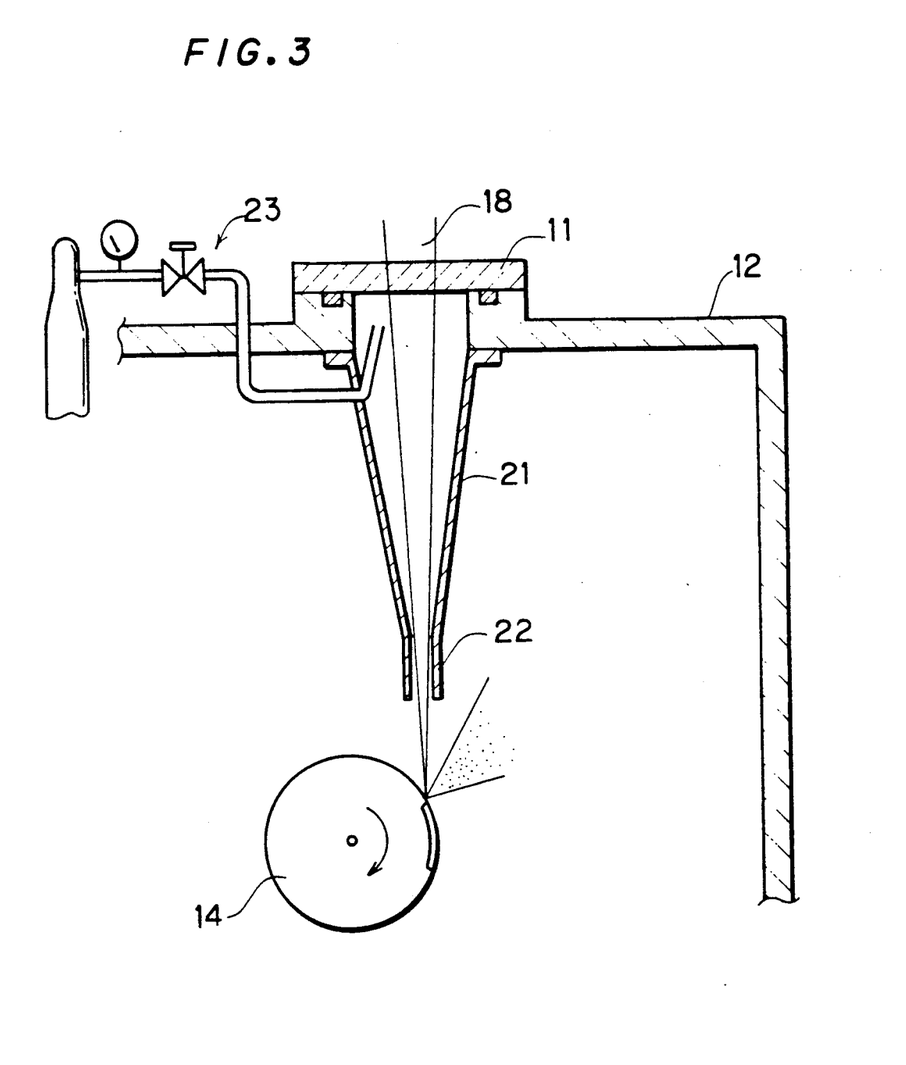
FIG. 3 is an enlarged sectional view of a major portion of FIG. 2.

FIG. 2 is a schematic diagram showing a thin film vacuum evaporation device according to an embodiment of the present invention, and FIG. 3 is an enlarged sectional view of a major portion of FIG. 2.

As shown in those figures, a discharging means 13 is connected to a reaction chamber 12 having a light transmitting window 11. A target 14 which consists, for example, of alumina, quartz glass or the like is rotatably held in the reaction chamber 12. Further, a member, such as a substrate 15, which is to be deposited is disposed opposite to the target 14 and a heater 16 for heating the substrate 15 is placed.

Outside the reaction chamber 12, a laser oscillator 17 such as a $CO_2$ laser oscillator is placed. A laser beam 18 emitted by the laser oscillator 17 is reflected by a mirror 19 and thereafter converged by a converging lens 20 to pass through the light transmitting window 1 and focus on the target 14.

Inside the reaction chamber 12, a nozzle 21 is attached to cover the light transmitting window 11. At the tip of the nozzle 21, an orifice 22 of the size enough to pass a beam of light through is defined on an optical path of the laser beam 18. Further, reaction gas introducing facilities 23 are connected to the nozzle 21 to introduce a reaction gas thereto.

The orifice 22 is intended to enhance the directivity of the reaction gas ejected from the nozzle 21, and the orifice 22 is so oriented that the reaction gas is locally supplied to a laser beam focused position on the target 14. The smaller the inner diameter of the orifice 22 is, within range that the laser beam 18 does not directly strike against the inner surface of the orifice 22, the better. For example, the inner diameter may be approximately 6 to 8 mm. Other parts of the structure are similar to corresponding parts of the structure of the conventional embodiment, and the detailed description of them is omitted.

In this thin film vacuum evaporation device, first a hard vacuum is kept in the reaction chamber 12 by the discharging means 13, while the reaction gas such as oxygen is successively supplied to the nozzle 21 by the reaction gas introducing facilities 23. Under the condition, the target 14 is rotated in a specified direction, while the substrate 15 is heated by the heater 16, as required, and the laser beam 18 is emitted by the laser oscillator 17. The laser beam 18 emitted by the laser oscillator 17 is reflected by the mirror 19, and thereafter focused by the converging lens 20. Then, the focused laser beam 18 passes through the light transmitting window 11 and the orifice 22 and strikes against the target 14. This causes the target 14 made of a substance, such as alumina and quartz glass, having a high fusing point to fuse and evaporate at a point where the laser beam 18 strikes. At this time, the reaction gas is supplied to the evaporating point on the target 14 with appropriate directivity by the nozzle 21 through the orifice 22, so that molecules composing the target 14 are prevented from being decomposed upon evaporation. Thus, a good quality of thin film can be formed on the substrate 15. Since the reaction gas is supplied to the evaporating point with appropriate directivity by virtue of the orifice 22, the flow rate of the reaction gas required for forming the improved quality of thin film may be considerably small.

Figure 4:
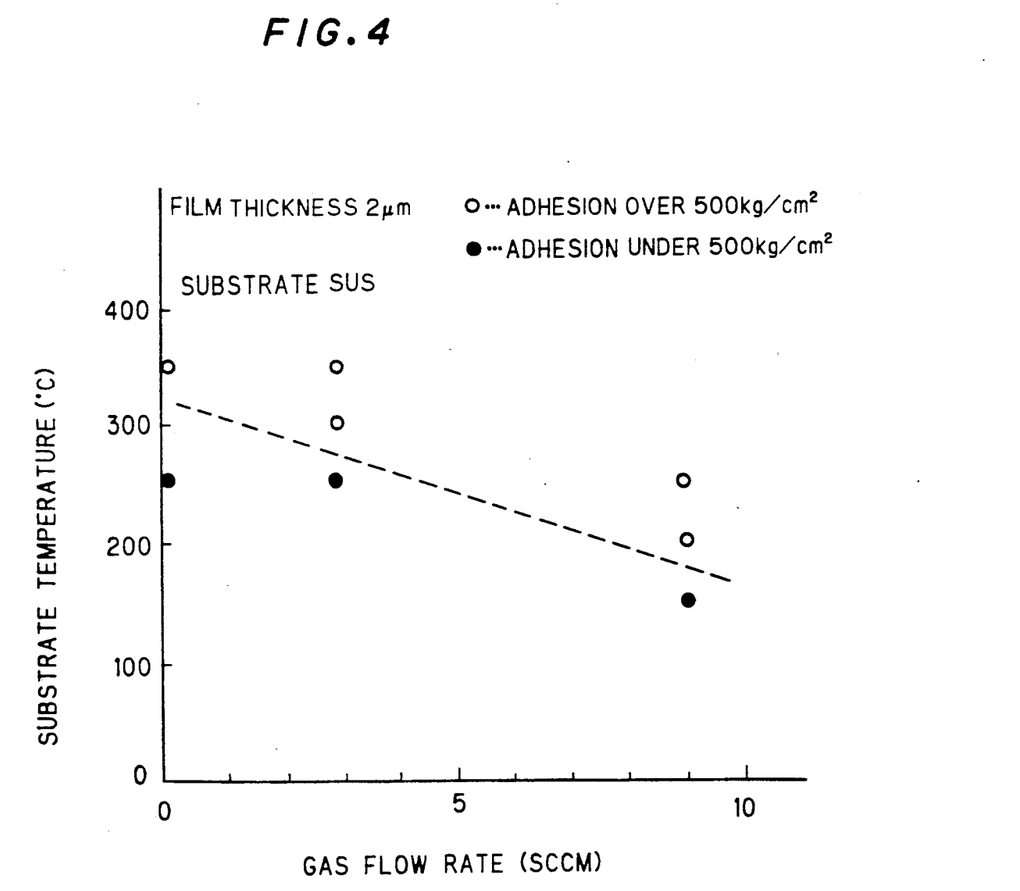
FIG. 4 is a diagram showing the results of measurement of the adhesion of a thin film to a substrate.

FIG. 4 shows the results of measurement of the adhesion of a thin film to the substrate 15 under the condition that, in practice, the thin film of 2 $\mu$m thickness is formed by appropriately determining the flow rate of the gas and the temperature of the substrate 15 in advance, where the substrate 15 is made of stainless, the target 14 is made of $SiO_2$ and the reaction gas is $O_2$. In FIG. 4, the horizontal axis represents the flow rate of the gas, and the vertical axis represents the temperature of the substrate. Symbol ◯ represents that large adhesion (500 kg/cm² or over) is obtained, while symbol ● represents that it is not. When the gas is not supplied, the temperature of the substrate 15 must rise to 300° C. or over to obtain the adhesion of 500 kg/cm² or over.

However, when the oxygen of 9 SCCM is supplied, such large adhesion is obtained even when the temperature of the substrate 15 falls to 200° C. There is a tendency that with greater flow rate of the gas, large adhesion is obtained at lower temperature. The reason why the supply of gas improves the adhesion may be that the improvement of the quality of the thin film reduces the stress in the thin film.

Thus, the flow rate of gas required for the improvement of the quality of the thin film may be very small, and hence, a hard vacuum at the level of $10^{-4}$ Torr of the pressure in the reaction chamber 12 is still kept. By virtue of this, the discharging means 13 and the heater 16 are not damaged, nor is the vapor deposition speed reduced by the scattering of the vapor due to the reaction gas.

In the above-mentioned embodiment, a combination of the target 14 made of quartz glass and the reaction gas of oxygen is used, but the present invention is not limited by the kind of employed gas or target. The combination of alumina and oxygen, or that of boron nitride and nitrogen may give the same effect.

The light source employed is not limited to the $CO_2$ laser oscillator 17, but a YAG laser oscillator or an excimer laser oscillator may be used depending on the target 14.

Figure 5:
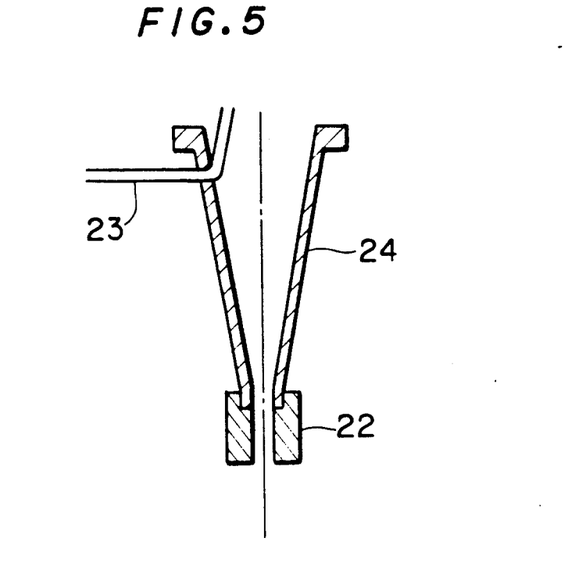
FIGS. 5 and 6 are diagrams showing variations of an orifice, respectively.
Figure 6:
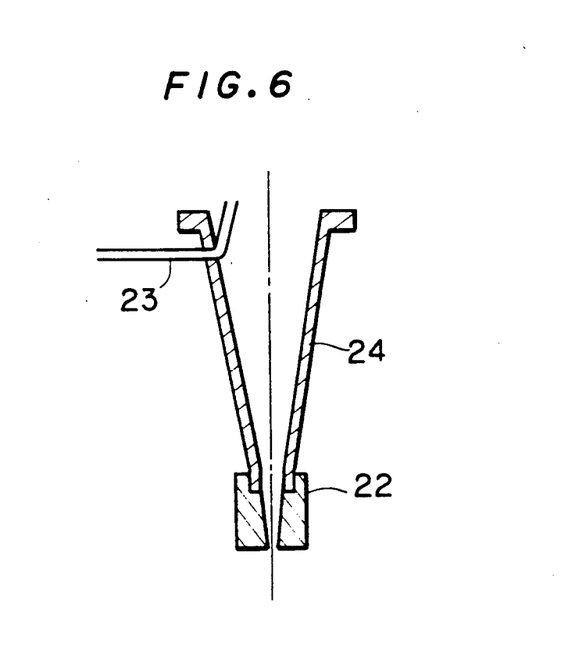

The orifice 22 may have several variations in shape. As shown in FIG. 5, for example, the orifices 22 may be formed with a different member from a nozzle body 24. This makes the formation of the orifice 22 easier. Additionally, as shown in FIG. 6, the inner peripheral surface of the orifice 22 may be tapered so that the inner diameter of the orifice 22 gradually becomes smaller from a point closer to the light transmitting window 11 to the end closer to the target 14. This further enhances the directivity of the reaction gas though the difficulty in forming the orifice 22 is increased.

Figure 7:
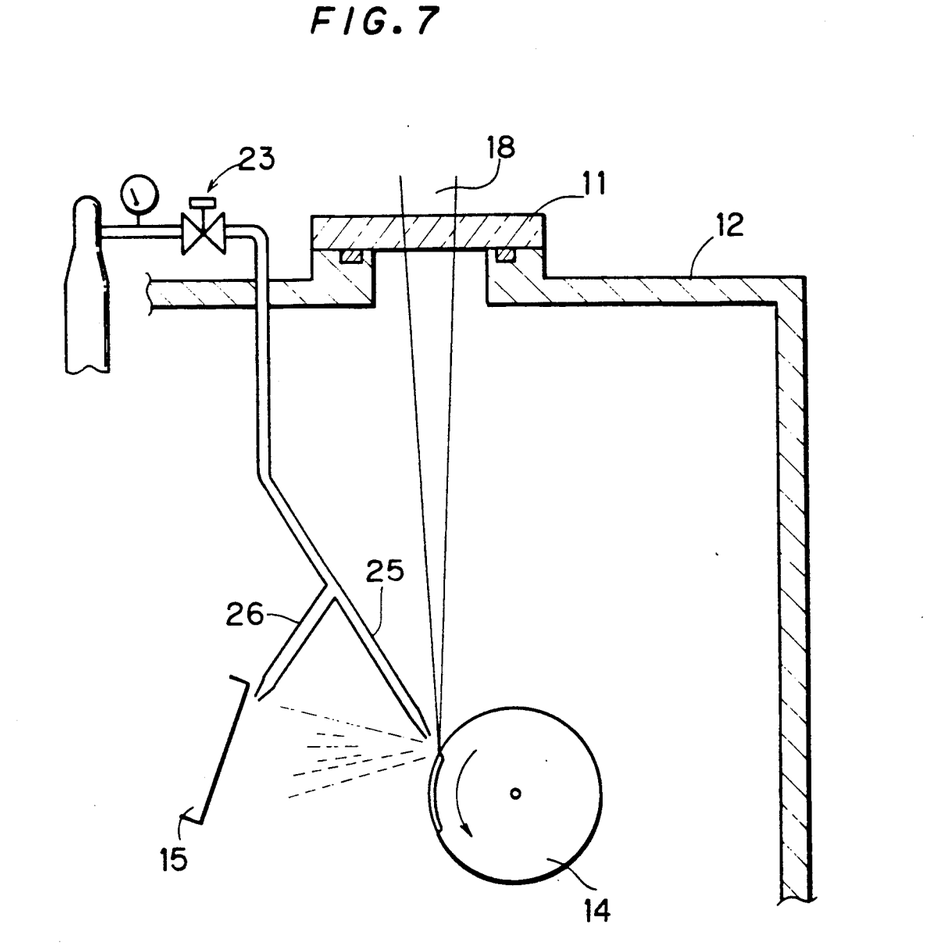
FIG. 7 is a diagram showing a variation of a reaction gas introducing facilities.

Although FIG. 3 shows an example by which the reaction gas is supplied through the nozzle 21, the reaction gas may be ejected directly to the evaporating point of the target 14 through a pipe 25, as shown in FIG. 7. In this case, the pipe 25 is placed in the position other than the optical path of the laser beam 18 not to block the laser beam 18 propagating to the target 14. At the same time, the reaction gas may be ejected onto the surface of the substrate 15 through a pipe 26. This allows the diameters of orifices at the tips of the pipes 25, 26 to be determined indifferent of the beam diameter of the laser beam 18, so that the orifice diameters can be set smaller to further enhance the directivity of the reaction gas.

Figure 8:
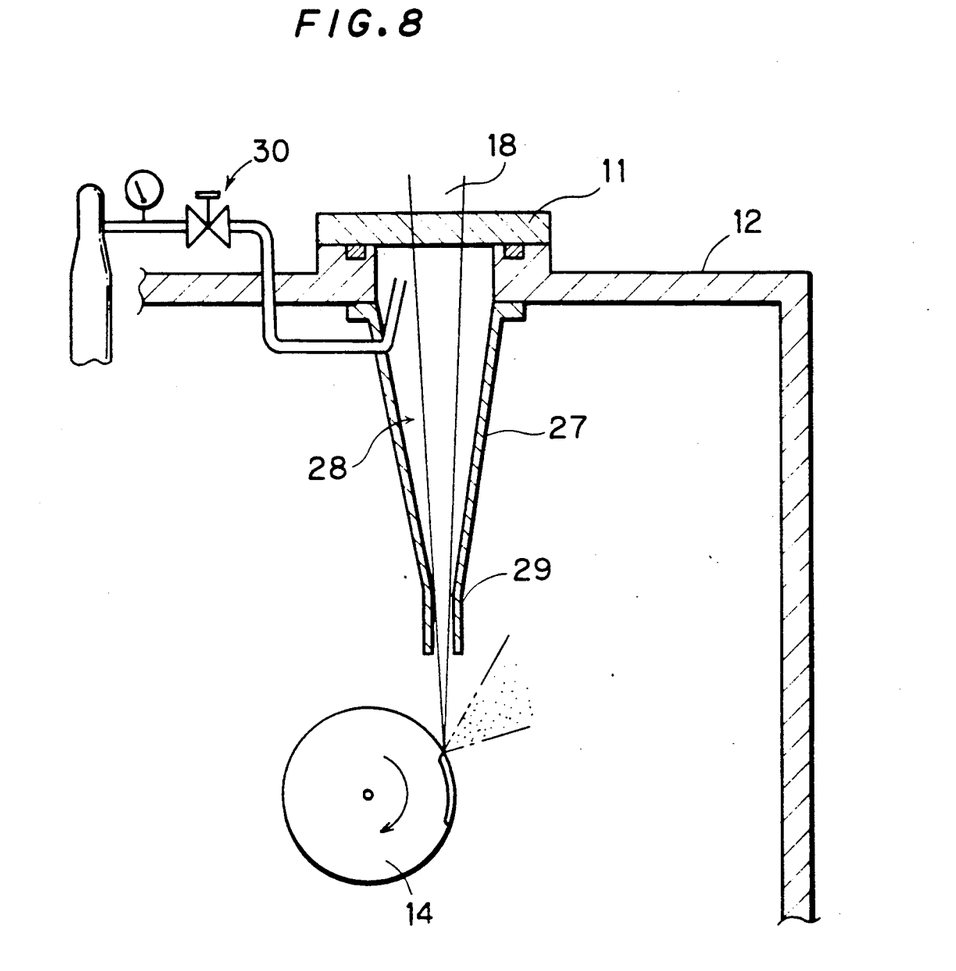
FIG. 8 is a schematic view of the thin film vacuum evaporation device according to another embodiment of the present invention.

FIG. 8 is a schematic view showing the thin film vacuum evaporation device according to another embodiment of the present invention.

In this thin film vacuum evaporation device, as shown in FIG. 8, a partition wall 27 is provided inside the reaction chamber 12 to cover the light transmitting window 11, so as to define a differential pressure chamber 28 enclosed by the partition wall 27. An orifice 29 large enough to pass the laser beam 18 through is defined on the optical path of the laser beam 18 at an end of the partition wall 27. Gas introducing facilities 30 are connected to the partition wall 27 to introduce a gas such as Ar, He, or $N_2$ to the differential pressure chamber 28.

In order to make discharging conductance small, the smaller the inner diameter of the orifice 29 is, within range that the laser beam 18 does not directly strike against the inner surface of the orifice 29, the better. For example, the orifice 29 may be about 8 mm in diameter and 25 mm in length. Other parts of the structure of this embodiment are similar to those in the embodiment shown in FIG. 2, and like reference numerals represent corresponding parts and the explanation thereof is omitted.

In this thin film vacuum evaporation device, except that the gas such as Ar, He, or $N_2$ is supplied into the differential pressure chamber 28 by the gas introducing facilities 30, the thin film is formed in the same way as in the embodiment shown in FIG. 2.

Supplying the gas through the orifice 29 causes a large pressure difference between the differential pressure chamber 28 enclosed by the partition wall 27 and the inner space of the reaction chamber 12 even if the flow rate of the gas is small. For example, when several SCCM of gas is supplied, it is possible to set the pressure in the differential pressure chamber 28 at $10^{-2}$ to $10_{-1}$ Torr with the pressure at the level of $10^{-4}$ being kept in the reaction chamber 12. When the pressure is $10^{-2}$ Torr, average free path of molecules of the gas is very short no more than 5 mm. This means that the molecules of the gas furiously collide against each other in the differential pressure chamber 28. The vapor generated also collides against the gas molecules on the way to the light transmitting window 11 in the differential pressure chamber 28 and scatters therein. This causes the vapor to move out of its path, and hence a very small quantity of the vapor reaches the light transmitting window 11. Additionally, the flow rate of the gas is very small and the pressure in the reaction chamber 12 is still kept at the hard vacuum state, whereby the quality of the deposited film is not deteriorated.

Figure 9:
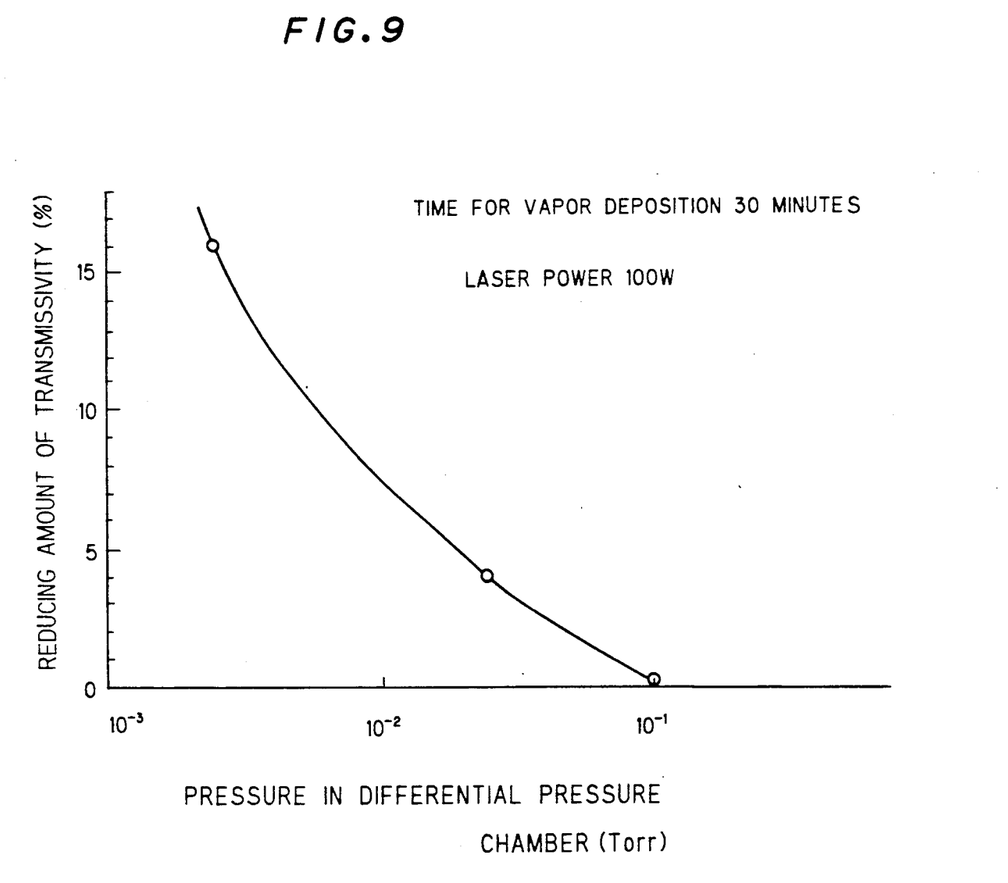
FIG. 9 is a diagram showing relations between the pressure in a differential pressure chamber and the reducing amount of transmissivity.

Practically, the pressure in the differential chamber 28 and the decreasing amount of transmissivity of the light transmitting window 11 are correlatedly measured with the result as shown in FIG. 9, under the condition of laser power 100 W and 30-minute-vapor deposition. As can be seen, the decrease in transmissivity can be held down to 0.2% at $10^{-1}$ Torr, although it is lowered as much as 16% simply with 30-minute-vapor deposition in the conventional way.

The kind of the laser light source used in the embodiment shown in FIG. 8 is not specified, but an arbitrary light source such as a YAG laser or an excimer laser can be used; and similar effect can be obtained with any light source. The kind of the target 14 and the gas, and the flow rate thereof are not specified, too.

Figure 10:
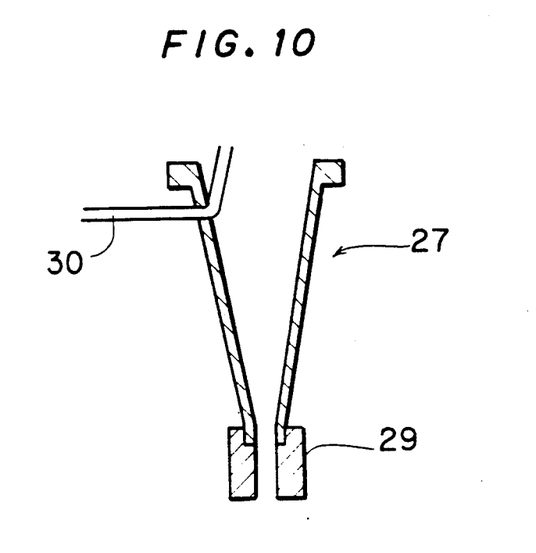
FIGS. 10 and 11 are diagrams showing variations of an orifice, respectively.
Figure 11:
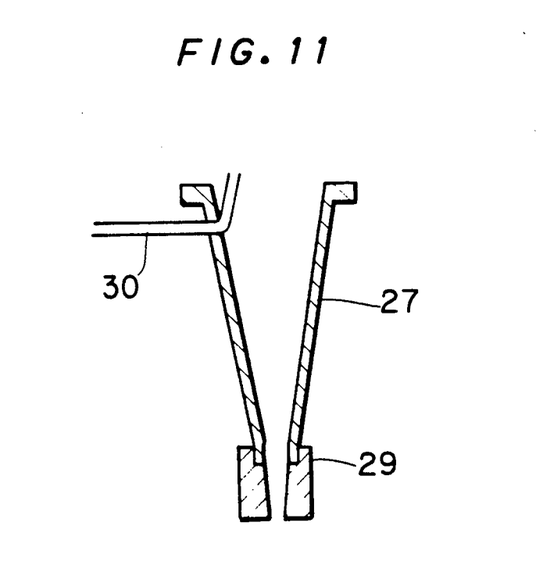

The orifice 29 may be formed by a different member from the partition wall 27 as shown in FIG. 10, or the inner surface of the orifice 29 may be tapered as shown in FIG. 11 similar to the embodiment shown in FIG. 6. With the structure shown in FIG. 10, the orifice 29 can be easily formed, and with the structure shown in FIG. 11, the discharging conductance can be made smaller although the difficulty in forming the orifice 29 increases.

In the aforementioned embodiment, the light converging lens 20 and the light transmitting window 11 are separately formed, but the light transmitting window 11 may serve also as a light converging lens with the same effect as in the above embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film vacuum evaporation device, comprising:
   a reaction chamber having a light transmitting window;
   discharging means connected to said reaction chamber for keeping a vacuum in said reaction chamber;
   a target held in said reaction chamber;
   light beam directing means for directing a beam of light to a light beam focusing position on said target through said light transmitting window to evaporate a part of said target;
   a member held in said reaction chamber, on which evaporated material from said target is deposited; and
   gas supplying means for locally supplying a reaction gas to said light beam focusing position on said target.

2. A device according to claim 1, wherein said gas supplying means includes:
   a nozzle member attached inside said reaction chamber to cover said light transmitting window and having an orifice, positioned on an optical path of the light beam, of size sufficient to pass the light beam through the orifice; and
   gas introducing means for supplying a reaction gas into said nozzle member.

3. A device according to claim 2, wherein said orifice is formed by a member attached to said nozzle member.

4. A device according to claim 2, wherein the inner diameter of said orifice gradually becomes smaller from a point closer to said light transmitting window to the end closer to said target.

5. A device according to claim 1, wherein said gas supplying means has a gas ejecting outlet provided in a position other than an optical path of the light beam.

6. A thin film vacuum evaporation device, comprising:
   a reaction chamber having a light transmitting window;
   discharging means connected to said reaction chamber for keeping a vacuum in said reaction chamber;
   a target held in said reaction chamber;
   light beam directing means for directing a beam of light to said target through said light transmitting window to evaporate a part of said target;
   a member held in said reaction chamber, on which evaporated material from said target is deposited;
   a differential pressure chamber enclosed by a partition wall formed to cover said light transmitting window within said reaction chamber and provided with an orifice, positioned on an optical path of the light beam, of size sufficient to pass the beam of light through the orifice; and
   gas introducing means for introducing a gas into said differential pressure chamber.

7. A device according to claim 6, wherein said orifice is formed by a member attached to said partition wall.

8. A device according to claim 6, wherein the inner diameter of said orifice gradually becomes smaller from a point closer to said light transmitting window to the end closer to said target.

* * * * *